(12) United States Patent
Rori et al.

(10) Patent No.: US 12,725,672 B2
(45) Date of Patent: Sep. 1, 2026

(54) WORDLINE RAMP RATE MONITOR FOR EARLY DETECTION OF DEFECT ACTIVATION

(71) Applicant: MICRON TECHNOLOGY, INC., Boise, ID (US)

(72) Inventors: Fulvio Rori, Boise, ID (US); Pitamber Shukla, Boise, ID (US); Chiara Cerafogli, Boise, ID (US); Erasmo Jose B. Vargas, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 22 days.

(21) Appl. No.: 18/774,447

(22) Filed: Jul. 16, 2024

(65) Prior Publication Data

US 2025/0046390 A1 Feb. 6, 2025

Related U.S. Application Data

(60) Provisional application No. 63/530,612, filed on Aug. 3, 2023.

(51) Int. Cl.
*G11C 29/12* (2006.01)

(52) U.S. Cl.
CPC .................. *G11C 29/12005* (2013.01); *G11C 2029/1202* (2013.01)

(58) Field of Classification Search
CPC ...... G11C 29/12005; G11C 2029/1202; G11C 29/025; G11C 29/12; G11C 16/06
USPC .......................................................... 714/721
See application file for complete search history.

(56) References Cited

U.S. PATENT DOCUMENTS 7,073,104 B1 * 7/2006 Li .................... G11C 29/12005 365/185.19
2009/0052256 A1 * 2/2009 Sutardja ................. G11C 29/02 365/189.09
2024/0071544 A1 * 2/2024 Zainuddin ........... G11C 11/5628
2024/0290412 A1 * 8/2024 Thoppa ............ G11C 29/12005

* cited by examiner

*Primary Examiner* — James C Kerveros
(74) *Attorney, Agent, or Firm* — Lowenstein Sandler LLP

(57) ABSTRACT

A methods and system directed to a wordline ramp rate monitor for early detection of defect activation are disclosed. A memory access directed to a wordline is initiated. Based on an applied ramping voltage, a ramp rate of the wordline is determined. Responsive to determining that the ramp rate satisfied a defect condition, the memory access operation is aborted.

20 Claims, 6 Drawing Sheets

WORDLINE RAMP RATE MONITOR FOR EARLY DETECTION OF DEFECT ACTIVATION

REFERENCE TO RELATED APPLICATION

This application claims benefit of U.S. Provisional Patent Application No. 63/530,612, filed Aug. 3, 2023, the entirety of which is incorporated herein by reference.

TECHNICAL FIELD

Embodiments of the disclosure relate generally to memory sub-systems, and more specifically, relate to a wordline ramp rate monitor for early detection of defect activation in a memory sub-system.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1:
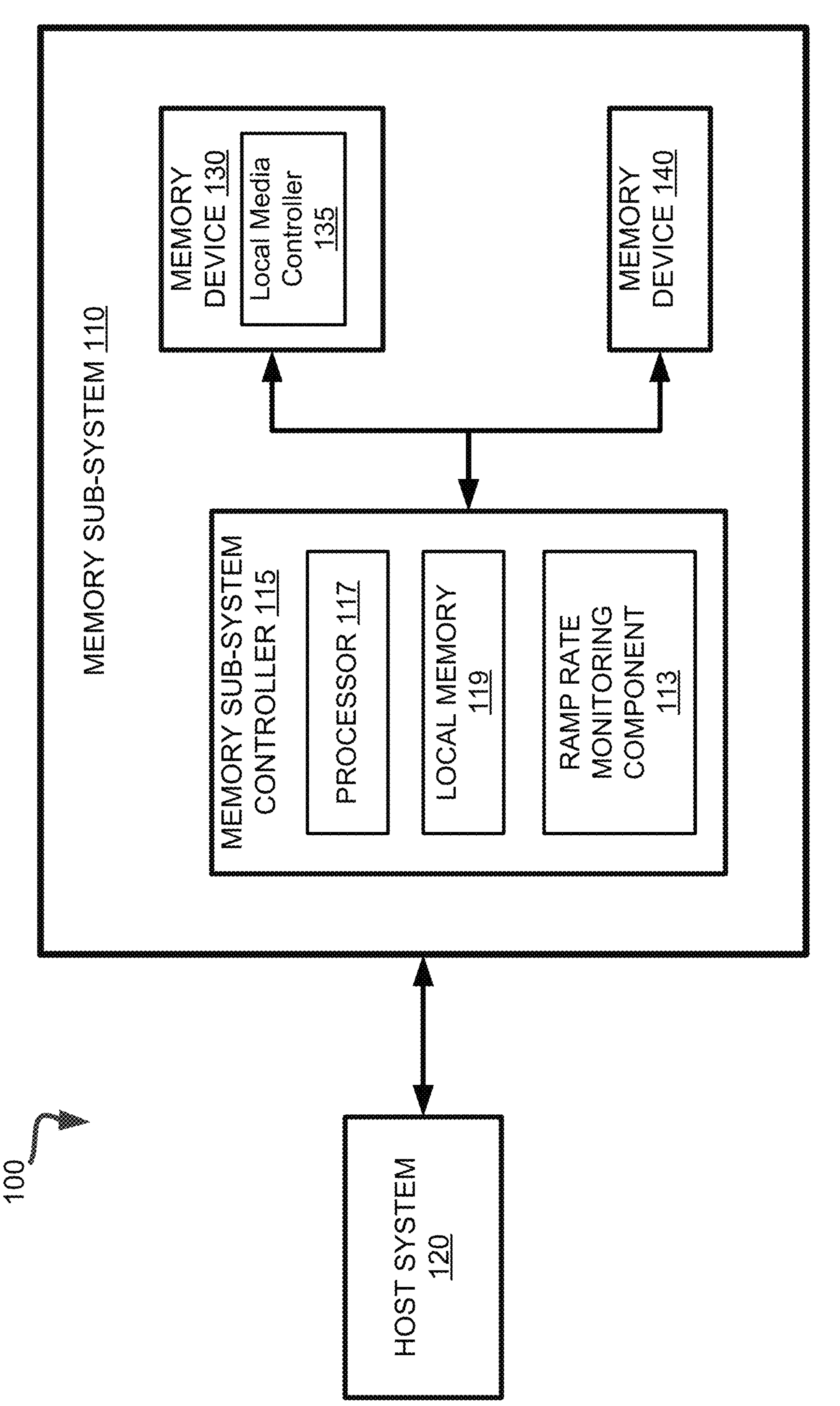
FIG. 1 illustrates an example computing system that includes a memory sub-system in accordance with some embodiments of the present disclosure.

Aspects of the present disclosure are directed to a wordline (WL) ramp rate monitor for early detection of defect activation in a memory sub-system. A memory sub-system can be a storage device, a memory module, or a combination of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a not-and (NAND) memory device. Other examples of non-volatile memory devices are described below in conjunction with FIG. 1. A non-volatile memory device is a package of one or more dies. Each die can includes of one or more planes. For some types of non-volatile memory devices (e.g., NAND devices), each plane includes of a set of physical blocks. Each block includes of a set of pages. Each page includes of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

A memory device can be made up of bits arranged in a two-dimensional or a three-dimensional grid. Memory cells are formed onto a silicon wafer in an array of columns (also hereinafter referred to as bitlines) and rows (also hereinafter referred to as wordlines). A wordline can have a row of associated memory cells in a memory device that are used with one or more bitlines to generate the address of each of the memory cells. The intersection of a bitline and wordline constitutes the address of the memory cell. A block hereinafter refers to a unit of the memory device used to store data and can include a group of memory cells, a wordline group, a wordline, or individual memory cells. One or more blocks can be grouped together to form separate partitions (e.g., planes) of the memory device in order to allow concurrent operations to take place on each plane. The memory device can include circuitry that performs concurrent memory page accesses of two or more memory planes. For example, the memory device can include multiple access line driver circuits and power circuits that can be shared by the planes of the memory device to facilitate concurrent access of pages of two or more memory planes, including different page types. For ease of description, these circuits can be generally referred to as independent plane driver circuits. Depending on the storage architecture employed, data can be stored across the memory planes (i.e., in stripes). Accordingly, one request to read a segment of data (e.g., corresponding to one or more data addresses), can result in read operations performed on two or more of the memory planes of the memory device.

The memory sub-system further includes a memory sub-system controller that can communicate with the memory devices to perform memory access operations such as reading data, writing data, or erasing data at the memory devices and other such operations. A memory sub-system controller is described in greater detail below in conjunction with FIG. 1. The operations can be performed in response to access requests (e.g., write commands, read commands) sent by a host system to the memory sub-system, such as to store data on a memory device of the memory sub-system and to read data from the memory device of the memory sub-system. The data to be read or written, as specified by a host request, is hereinafter referred to as "host data." A host request can include logical address information (e.g., logical block address (LBA), namespace) for the host data, which is the location the host system associates with the host data. The logical address information (e.g., LBA, namespace) can be part of metadata for the host data. The metadata and host data, together, is hereinafter referred to as "payload." The operations can further be initiated by the memory sub-system as media management operations, which can include executing, for example, a write operation, a read operation, or an erase operation, on host data that is stored on a memory device. For example, the memory sub-system can re-write previously written host data from a location on a memory device to the same location or a new location as part of a write refresh operation. In another example, the media management operations can include a re-read of host data that is stored on a memory device as part of a read refresh operation. During a memory access operation (such as a program operation), a high voltage can be generated by the charge pump and applied to a regulator. A charge pump is a circuit that can raise or lower the voltage applied to the wordlines during a memory access operation, to attain a target voltage level. A regulator (sometimes referred to as a voltage regulator) is a circuit that maintains a stable and regulated voltage level within the memory device. The high voltage can be applied, for example, during a program pulse and/or a program verify operation.

As described above, a non-volatile memory device can include a number of individual blocks, each referencing a set of one or more wordlines that are used to access the memory cells of the block. Over time, as memory access operations, including program operations, read operations, and erase operations, are repeatedly performed on the blocks of the memory device, certain defects can develop. For example, an electrical short can develop between two adjacent wordlines. When a certain voltage, such as a program voltage, for example, is applied to one of those wordlines, a current is developed, at least a portion of which can flow through the electrical short and onto the adjacent wordline. This defect can be referred to as a wordline-to-wordline short. As another example, an electric short can develop between a wordline and a pillar (e.g., a conductive trace), and can be referred to as a wordline-to-pillar short. This portion of the current can be referred to as a "leakage current." This leakage current can impact the logical values programmed to or read from the memory cells connected to the associated wordlines leading to errors on the memory device. Furthermore, a wordline-to-wordline and/or wordline-to-pillar short can cause the charge pump and/or the regulator to collapse. In the event of a wordline-to-wordline short and/or a wordline-to-pillar short, the charge pump and/or the regulator are not able to maintain the high voltage applied during a memory access operation. That is, once a wordline-to-wordline or wordline-to-pillar short defect is active, the short will sink current from the pump and/or the regulator, which in turn will not be able to maintain the target voltage. As a result, the bias along the string can be compromised, which can result in a permanent data loss.

The memory sub-system can employ an error detection/correction engine capable of detecting and correcting a certain number of errors. Such detection/correction engines may use an error correction code (ECC) to detect and/or correct the errors. An ECC failure results when the detection/correction engine is not capable of correcting the errors within the data being read. This can be referred to as an uncorrectable ECC error (a UECC error). Certain physical defects, including a wordline-to-wordline short or a wordline-to-pillar short, are considered UECC errors and, responsive to detecting such an error, the memory sub-system can retire the corresponding block and/or wordline such that it is not used to store data going forward. In addition, in a multi-plane device, a defect in a block of one plane can also impact blocks in a neighboring plane, even if that neighboring plane does not have such a defect. Other defects besides a wordline to wordline short are also possible on the memory device.

When such a UECC error occurs while data is being written to the memory device during a program operation, all or a portion of the data can be incorrectly stored on the memory device. In addition, once the data being written is removed from any associated buffer, that data might be permanently lost. Certain conventional memory sub-systems attempt to detect defects on the memory device with limited success. For example, some systems monitor the operation of a charge pump configured to raise or lower the voltage applied to the wordlines of the memory device during memory access operations. When a wordline-to-wordline short (and/or a wordline-to-pillar short) is present on the memory device, the charge pump may have to work harder to reach a desired voltage level (e.g., a program voltage) because of the leakage current that flows across the short. The system can detect this overworking and conclude that a wordline-to-wordline short (and/or a wordline-to-pillar short) is present on the memory device. Such detection methods usually require the voltage of the wordline to reach the target voltage value (or nearly reach the target voltage value), and/or include a long observation phase. In such cases, in the event of a defect, the voltage of the wordline would be sufficiently high to cause an unrecoverable disturb on wordlines that are already programmed. Furthermore, in a multi-plane device, the charge pump is generally shared by multiple planes. Accordingly, even if any overworking of the charge pump is detected, the particular plane with the defect that caused the charge pump to overwork is not immediately known. Thus, the system must perform a separate operation to test each individual plane of the memory device to identify the particular plane with the defect. This leads to additional latency in detecting the defect and reduced bandwidth for performing other operations.

Aspects of the present disclosure address the above and other deficiencies by detecting a defect (e.g., caused by a leaky wordline) based on a measurement of the rate of change of a voltage signal applied to a given wordline during a memory access operation (such as a program, read, or erase operation). The measurement of the rate of change can be referred to as the ramp rate of the voltage signal. An irreversible defect can be preceded by a change in the resistance capacitance (RC) of a wordline. Thus, the ramp rate has a linear relationship with the RC of the wordline. During a memory access operation, the voltage on the accessed wordline transitions from an initial voltage level (e.g., a standby voltage level) to a target voltage level (e.g., an access voltage level). The rate of change of the voltage level as it transitions from one level to another can be referred to as the ramp rate. For example, the ramp rate may be depicted in graphical form, as shown in FIG. 2B, as the slope of the leading edge of a program pulse 231, 230.

In one embodiment, the ramp rate can be estimated using voltage detectors. A voltage detector can continuously monitor the supply voltage of a memory device, and can detect whether the supply voltage exceeds a threshold level. Based on the detected voltage, the voltage detector can trigger an action. The memory sub-system can include two voltage detectors that can detect specific voltage levels applied to a wordline as part of a memory access operation. The first voltage detector can detect a first voltage level, and the second voltage can detect a second voltage level. Upon detecting the first voltage level, the first voltage detector can enable (i.e., start) a counter. The counter is connected to a clock, and counts the clock cycles while enabled. Upon detecting the second voltage level, the second voltage detector can disable (i.e., stop) the counter. Thus, the counter counts the number of clock cycles between the applied voltage transitioning from the first voltage level and to the second voltage level. That is, the counter value corresponds to the time it took for the voltage to go from the first voltage level to the second voltage level. Furthermore, the counter value correlates to the ramp rate. The ramp rate is the rate of change of the voltage level as it transitions from the first voltage level to the second voltage level. The rate of change can be calculated as the difference in the voltage divided by the measured time, represented by the counter value.

In some embodiments, the counter value can be compared to predetermined threshold values to determine if the corresponding wordline is leaky, approaching a leaky status, or not leaky. In other embodiments, the ramp rate can be compared to predetermined ramp rate threshold values to determine if the corresponding wordline is leaky, approaching a leaky status, or not leaky. A leaky wordline is a wordline that is affected by a wordline-to-wordline or wordline-to-pill short. Thus, the voltage applied to a leaky wordline can result in leakage current. If the wordline is leaky, the memory access operation can be aborted and the block with which leaky wordline is associated can be retired. Aborting the memory access operation based on the ramp rate can stop the voltage supplied to the wordline from reaching the high voltage phase of the memory access operation. Thus, aborting the memory access operation at the ramp phase stage can avoid a pump and/or regulator collapse. If the wordline is approaching a leaky status, the memory access operation can proceed. In some embodiments, as a result of the wordline approaching a leaky status, the memory sub-system controller can perform preventive actions. In other embodiments, the memory sub-system controller can flag the approaching leaky status for the host to take preventive actions. Preventive actions can include, for example, copying previously programmed data from the block with which the leaky wordline is associated to into a good block, and/or retire the block with which the leaky wordline is associated. A retired block may no longer be trusted to be programmed with host or system data. In some embodiments, an indication of the retired block(s) can be stored in a list. If the wordline is not leaky, the memory access operation can proceed.

Advantages of the present disclosure include improved memory device performance and reliability. Embodiments of the present disclosure provide early detection of defective wordlines, e.g., during the ramp phase of a memory access operation, before the high voltage level of a memory access operation is reached. This avoids transmitting high voltage levels to a compromised string bias, and thus avoid irreversible defects that lead to permanent data loss. Furthermore, detecting leaky and/or near-leaky wordlines reduces current consumption. By detecting and addressing leaky and near-leaky wordlines before the high voltage level of a program operation is attained, the overall performance and reliability of the memory device is improved, without any undue latency penalties.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a not-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), not-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which is a raw memory device 130 having control logic (e.g., local media controller 135) on the die and a controller (e.g., memory sub-system controller 115) for media management within the same memory device package. An example of a managed memory device is a managed NAND (MNAND) device.

The memory sub-system 110 includes a ramp rate monitoring component 113 that can detect a leaky WL or near-leaky WL based on the ramp rate of a memory access operation. In some embodiments, the memory sub-system controller 115 includes at least a portion of the ramp rate monitoring component 113. In some embodiments, the ramp rate monitoring component 113 is part of the host system 120, an application, or an operating system. In other embodiments, local media controller 135 includes at least a portion of the ramp rate monitoring component 113 and is configured to perform the functionality described herein.

The ramp rate monitoring component 113 can monitor memory access operations performed on memory devices 130, 140. The ramp rate monitoring component 113 can identify the initiation of a memory access operation, such as a read operation, a write operation, an erase operation, and/or a refresh operation. Note that the ramp rate monitoring component 113 can identify other memory access operations not listed.

A memory access operation can include a ramp phase, in which a voltage is applied to activate the wordline to gradually increase the voltage from a lower voltage level to a target voltage level. The ramp rate monitoring component 113 can use two voltage detectors to determine the ramp rate of the applied ramping voltage. One voltage detector can sense when the applied voltage reaches a first voltage level, and a second voltage detector can sense when the applied voltage reaches a second voltage level. The amount of time it takes for the voltage level to ramp up from the first level to the second level represents the ramp rate. The first voltage detector can enable a counter when the applied voltage reaches the first voltage level, and the second voltage detector can disable the counter when the applied voltage reaches the second voltage level. While enabled, the counter counts the number of clock cycles. In some embodiments, the ramp rate monitoring component 113 can compare the value of the counter to predetermined counter threshold values to determine whether the wordline is a leaky wordline, a healthy wordline (i.e., not leaky), or somewhere in between (i.e., near leaky).

The ramp rate monitoring component 113 can compare the value of the counter (representing number of clock cycles) to a leaky WL counter threshold value. If the counter value exceeds a leaky WL counter threshold value, the ramp rate monitoring component 113 can determine that the wordline is leaky. A leaky WL indicates activation of a defect. Thus, the ramp rate monitoring component 113 can abort the memory access operation at the ramp phase, thus avoiding applying a high voltage to the leaky WL. The ramp rate monitoring component 113 can also retire the block with which the leaky WL is associated. Retiring the block with which the leaky WL is associated can include adding an indication of the retired block to a leaky block list. The block(s) listed in the leaky block list may no longer be used to store data.

The ramp rate monitoring component 113 can compare the value of the counter (representing number of clock cycles) to a near-leaky counter WL threshold value. If the counter value does not exceed the leaky WL counter threshold value but exceeds the near-leaky counter WL counter threshold value, the ramp rate monitoring component 113 can determine that the wordline is near-leaky. The near-leaky counter WL threshold value can indicate that the WL may have a leak, but it has not yet reached defective status. The ramp rate monitoring component 113 can allow the memory access operation to proceed but can retire the block with which the near-leaky WL is associated. This avoids future memory access operations to be performed on the near-leaky WL. Retiring the block with which the near-leaky WL is associated can include adding an indication of the retired block to a leaky block list. The blocks listed in the leaky block list may no longer be used to store data. If the counter value does not exceed either the leaky WL or the near-leaky WL counter threshold value, the ramp rate monitoring component 113 can allow the memory access operation to proceed.

In some embodiments, the local media controller 135 can compare the value of the counter to the predetermined counter threshold value(s). If the value of the counter exceeds the predetermined counter threshold value for a leaky WL, the local media controller 135 can send a signal to the ramp rape monitoring component 113. Upon receiving the signal, the ramp rate monitoring component 113 can then cause the memory access operation to be aborted and can cause the block with which the leaky WL is associated to be retired. If the value of the counter exceeds the predetermined counter threshold value for a near-leaky WL, the local media controller 135 can send a different signal to the ramp rate monitoring component 113. Upon receiving the signal, the ramp rate monitoring component 113 can cause the block with which the near-leaky WL is associated to be retired.

In some embodiments, the ramp rate monitoring component 113 can calculate the ramp rate of the WL based on the counter value. The ramp rate can be the difference between the second voltage level and the first voltage level, divided by the time it took for the voltage level to transition from the first voltage level to the second voltage level. The time can be represented by the counter value. The ramp rate monitoring component 113 can compare the ramp rate to predetermined ramp rate threshold values to determine whether the wordline is a leaky wordline, a healthy wordline (i.e., not leaky), or somewhere in between (i.e., near leaky).

The ramp rate monitoring component 113 can compare the ramp rate to a leaky WL ramp rate threshold value. If the ramp rate is less than the leaky WL ramp rate threshold value, the ramp rate monitoring component 113 can determine that the wordline is leaky. Thus, the ramp rate monitoring component 113 can abort the memory access operation at the ramp phase, thus avoiding applying a high voltage to the leaky WL. The ramp rate monitoring component 113 can also retire the block with which the leaky WL is associated.

The ramp rate monitoring component 113 can compare the ramp rate to a near-leaky ramp rate WL threshold value. If the ramp rate greater than or equal to the leaky WL ramp rate threshold but less than the near-leaky WL ramp rate threshold value, the ramp rate monitoring component 113 can determine that the wordline is near-leaky. The near-leaky ramp rate WL threshold value can indicate that the WL may have a leak, but it has not yet reached defective status. The ramp rate monitoring component 113 can allow the memory access operation to proceed, but can retire the block with which the near-leaky WL is associated. If the ramp rate exceeds both the leaky WL or the near-leaky WL ramp rate threshold values, the ramp rate monitoring component 113 can allow the memory access operation to proceed.

The predetermined threshold value(s) can be determined during manufacturing and/or characterization of the memory device. The first level detected by the first voltage detector and the second level detected by the second voltage detector can be determined during manufacturing and/or characterization. That is, these values (the predetermined threshold value(s), and/or the first and second voltage levels) can be parameters that can be adjusted and/or fine-tuned during manufacturing and/or characterization of the memory device. The predetermined threshold value(s) can correlate to the voltage level of the first voltage detector and the voltage level of the second voltage detector.

The voltage detectors can be placed within a memory device 130, 140. In some embodiments, the voltage detectors can be placed at the output of the regulators. In other embodiments, the voltage detectors can be placed at the global line driver (sometimes referred to as the wordline driver, which is responsible for driving the voltage signals of the wordlines).

The voltage detectors can enable or disable a counter that is configured to count clock cycles. The clock can operate within the corresponding memory device 130, 140, and/or within the memory sub-system 110. In some embodiments, the clock frequency can be adjusted (e.g., during manufacturing and/or characterization of the memory device). The frequency of the clock represents the number of clock cycles that occur within a period of time. A higher frequency clock can result in a more accurate ramp rate determination. For example, a frequency of one cycle every 30 nanoseconds can result in a counter value of 34 for a leaky WL, whereas a frequency of one cycle every 15 nanoseconds can result in a counter value of 69 for the same leaky WL. The frequency of the clock, the predetermined threshold voltage value(s) used to determine whether the WL is leaky or near-leaky, and the voltage levels detected by the voltage detectors are correlated, and can be set during the manufacturing and/or characterization of the memory device.

Figure 2A:
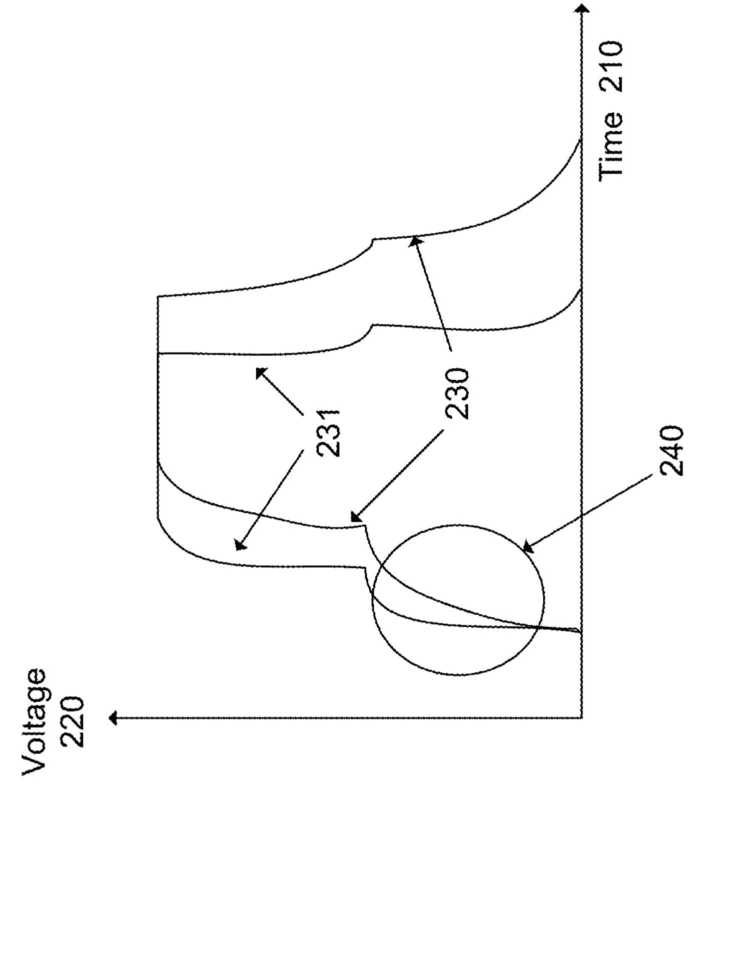
FIG. 2A is a graph of two program pulses with different ramp rates, in accordance with some embodiments of the present disclosure.
Figure 2B:
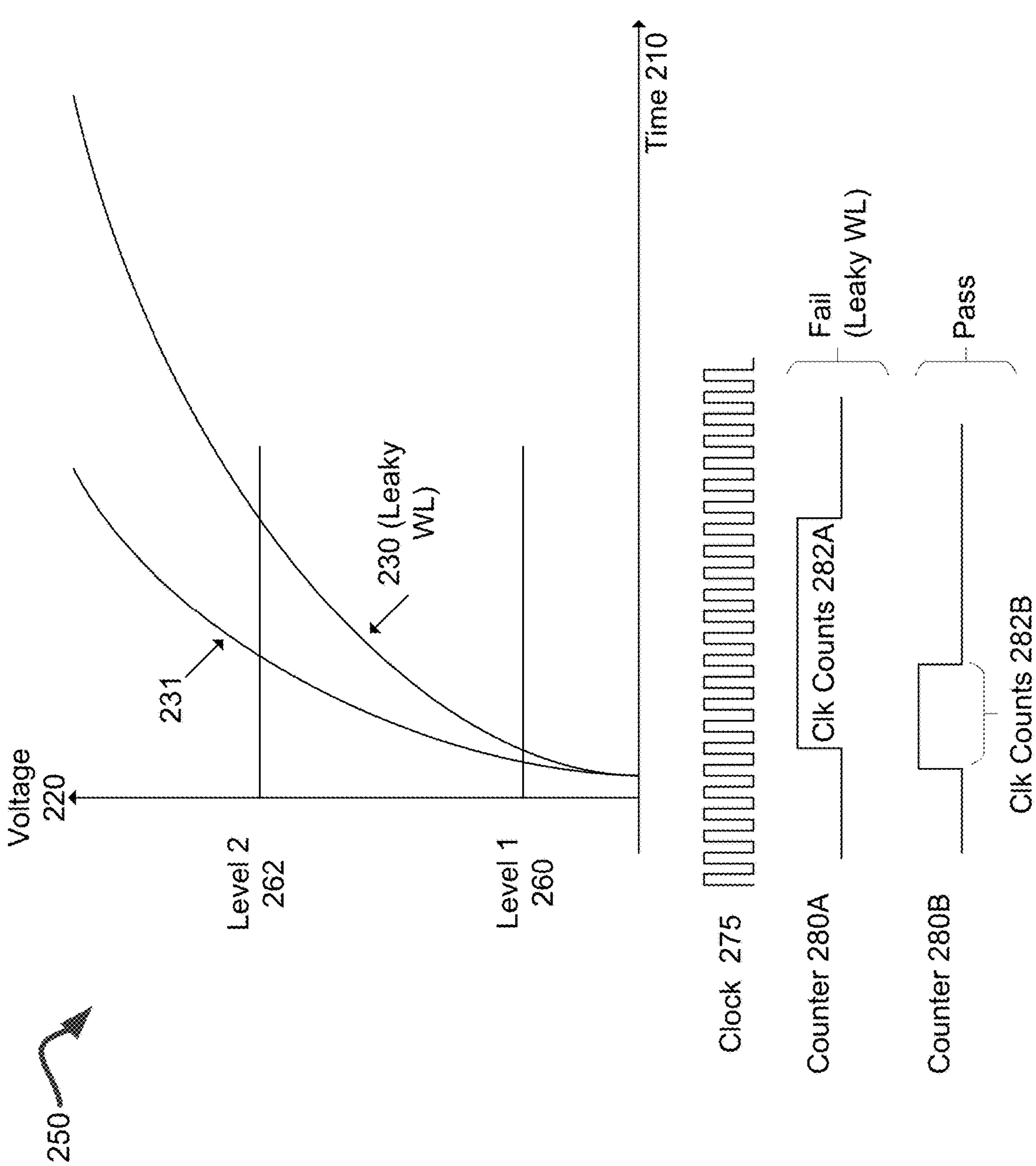
FIG. 2B schematically illustrates the determination of the ramp rate during a memory access operation, in accordance with some embodiments of the present disclosure.

FIG. 2A is a voltage-time graph 200 illustrating the voltage levels of two program pulses 230, 231 with different ramp rates, in accordance with some embodiments of the present disclosure. The y-axis of the graph 200 is the voltage level 220, and the x-axis of the graph 200 is time 210. Program pulse 231 illustrates the voltage level during a program operation applied on a non-leaky WL. Program pulse 230 illustrates the voltage level during a program operation applied on a leaky WL. Due to the leakage current, more voltage is applied to a leaky WL in order to achieve the same voltage levels. As a result, the amount of time it takes for the voltage to reach a certain level on a leaky WL is more than on a non-leaky WL.

The voltage level change illustrated in the area labeled 240 represents the ramp-up phase of the memory access operation. The ramp-up phase is a gradual increase in voltage levels in the initial phase of a memory access operation, such as a program operation. It should be noted that voltage-time graph 200 is provided as an illustrative example, and that embodiments of the present disclosure can be applied to a program verify pulse of a program operation, an erase operation, and/or to other memory access operations.

FIG. 2B schematically illustrates the determination of the ramp rate during a memory access operation, in accordance with some embodiments of the present disclosure. The voltage-time graph 250 illustrates the ramp-up phase of a program operation (i.e., graph 250 is a zoomed-in illustration of the area 240 of FIG. 2A). The y-axis of graph 250 is the voltage level 220, and the x-axis of graph 250 is time 210. As in FIG. 2A, program pulse 231 illustrates the voltage level during a program operation on a non-leaky WL, and program pulse 230 illustrates the voltage level during a program operation on a leaky WL.

Two voltage detectors (not illustrated) can be connected to the memory device (e.g., memory device 130, 140 of FIG. 1). The first voltage detector can detect the voltage at voltage level 1 260, the second voltage detector can detect the voltage at voltage level 2 262. Voltage level 1 261, and/or voltage level 2 262 can be determined during manufacturing and/or characterization of the memory device.

Clock 275 illustrates the cycles of a clock operatively coupled to the memory device (e.g., memory device 130, 140 of FIG. 1). Counter 280A illustrates the counter operating in connection with program pulse 230. Counter 280B illustrates the counter operating in connection with program pulse 231. Thus, counter 280A is enabled when the first voltage detector detects program pulse 230 at level 1 260, and is disabled when the second voltage detector detects program pulse 230 at level 2 262. Similarly, counter 280B is enabled when the first voltage detector detects program pulse 231 at level 1 260, and is disabled when the second voltage detector detects program pulse 231 at level 2 262.

Clock counts 282A represents the number of clock cycles counted while counter 280A is enabled, and clock counts 282B represents the number of clock cycles counted while counter 280B is enabled. In some embodiments, to determine whether a program pulse 230, 231 is leaky, near-leaky, or healthy, the ramp rate monitor component 113 can compare the clock counts 282A,B to counter threshold values. The counter threshold values can be, for example, a leaky WL counter threshold value and a near-leaky WL counter threshold value. In this illustrative example, clock counts 282A exceeds the leaky WL counter threshold value, and thus the wordline on which program pulse 230 is operating is determined to be leaky. Thus, the ramp rate monitoring component 113 (of FIG. 1) can abort the program operation during the ramp phase, before the applied voltage reaches the high voltage level (e.g., illustrated as the high point on the voltage-time graph 200 of FIG. 2A). The ramp rate monitoring component 113 can also retire the block with which the WL is associated.

In this illustrative example, clock counts 282B does not exceed the leaky WL counter threshold value, and thus the wordline on which program pulse 231 is operating is determined to be not leaky. Thus, the program operation can proceed. In some embodiments, the clock counts 282B can be compared to a near-leaky WL counter threshold value. If clock counts 282B exceeds the additional near-leaky WL counter threshold value (but is less than or equal to the leaky WL counter threshold value), the program operation associated with program pulse 231 can proceed, however the block with which the WL is associated can be retired.

In some embodiments, the ramp rate monitor component 113 can determine the ramp rate of the program pulses 230, 231. To determine the ramp rate, the ramp rate monitor component 113 can divide the difference in voltage levels between voltage level 2 262 and voltage level 1 260, by the clock counter value. For example, to determine the ramp rate of program pule 230, the ramp rate monitoring component 113 can determine voltage level 2 262 minus voltage level 1 260. The ramp rate monitoring component 113 can then divide that difference (voltage level 2 262 minus voltage level 1 260) by the clock counter value, clock counters 282A, to determine the ramp rate of program pulse 230. The ramp rate monitor component 113 can compare the ramp rate of program pulse 230 to a leaky WL ramp rate threshold value. In this illustrative example, the ramp rate of program pulse 230 is less than the leaky WL ramp rate threshold value, and thus the ramp rate monitoring component 113 can determine that the wordline on which program pulse 230 is operating is leaky. As described above, the ramp rate monitoring component 113 can abort the program operation during the ramp phase, and can optionally retire the block with which the WL is associated, on which program pulse 230 is operating.

As another example, to determine the ramp rate of program pule 231, the ramp rate monitoring component 113 can determine voltage level 2 262 minus voltage level 1 260. The ramp rate monitoring component 113 can then divide that difference (voltage level 2 262 minus voltage level 1 260) by the clock counter value, clock counters 282B, to determine the ramp rate of program pulse 231. The ramp rate monitor component 113 can compare the ramp rate of program pulse 231 to a leaky WL ramp rate threshold value. In this illustrative example, the ramp rate of program pulse 231 is not less than the leaky WL ramp rate threshold value, and thus the ramp rate monitoring component 113 can determine that the wordline on which program pulse 231 is operating is not leaky. The ramp rate monitoring component 113 can allow the program operation to proceed.

In some embodiments, the ramp rate can be compared to a near-leaky WL ramp rate threshold value. If the ramp rate of program pulse 231 is less than near-leaky WL ramp rate threshold value (but is greater than or equal to the leaky WL ramp rate threshold value), the ramp rate monitoring component 113 can determine that the WL on which the program pulse 231 is operating is near-leaky. The program operation associated with program pulse 231 can proceed, however the block with which the WL is associated can be retired.

Figure 3:
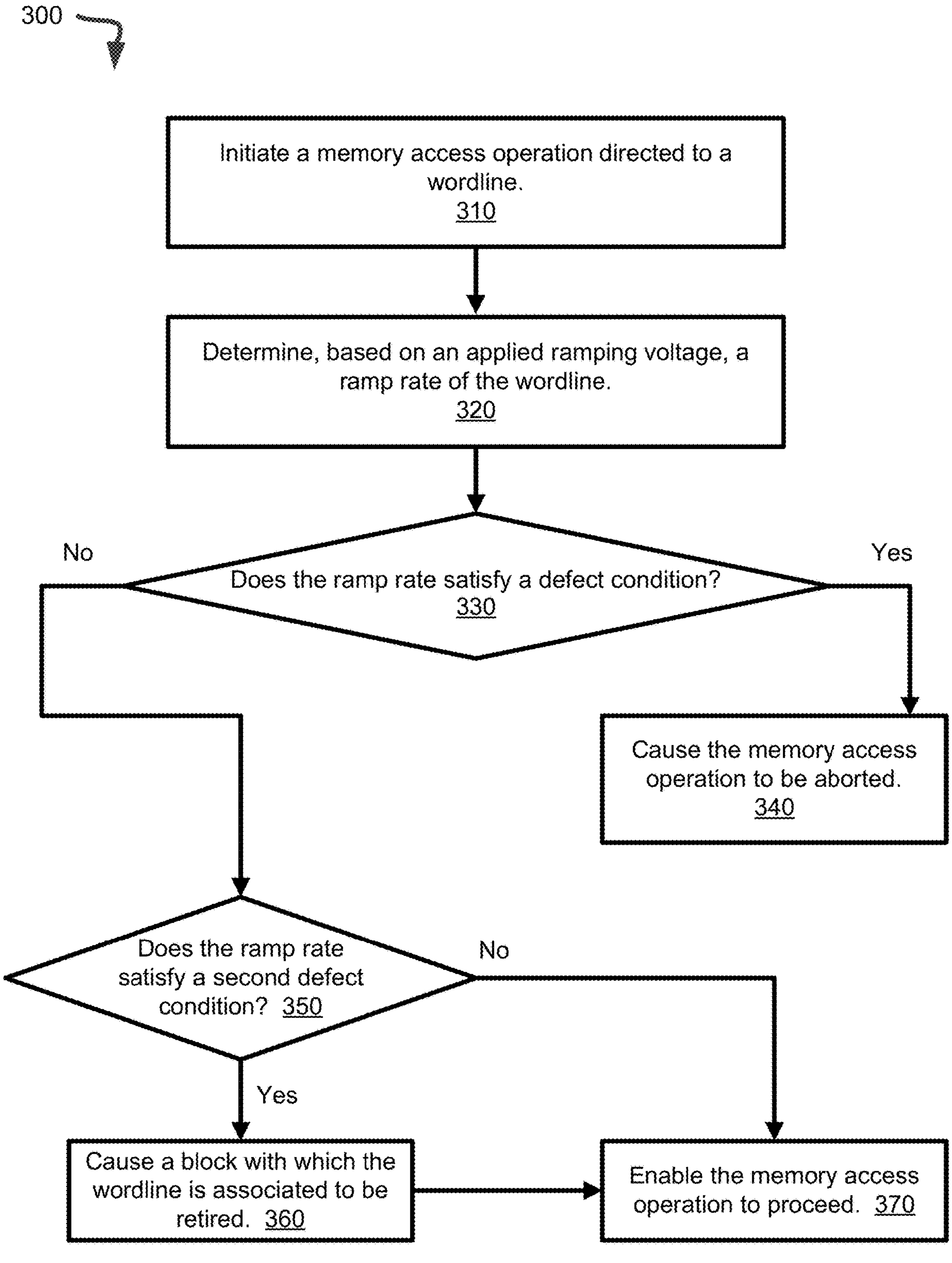
FIG. 3 is a flow diagram of an example method to detect a defect condition on a wordline, in accordance with some embodiments of the present disclosure.

FIG. 3 is a flow diagram of an example method 300 to detect a defect condition on a wordline, in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the ramp rate monitoring component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 310, the processing logic initiates a memory access operation directed to a wordline. The memory access can be a program operation, a sensing operation (i.e., a read operation), an erase operation, a refresh operation, or any other memory access operation. The memory access operation can cause a voltage to be applied to the wordline.

At operation 320, the processing logic determines, based on an applied ramping voltage, a ramp rate of a wordline. The ramp rate represents the rate of change of the voltage level as it transitions from one level to another, e.g., during the ramp phase of the memory access operation. In some embodiments, the processing logic can determine the ramp rate by causing a ramping voltage to a applied to the wordline. For example, the ramping voltage can correspond to a program pulse or a program verify pulse during a program operation. Responsive to determining that the ramping voltage reaches a first voltage level, the processing logic can enable a counter. The counter can correspond to a clock. Once enabled, the counter can count clock cycles of the clock. Responsive to determining that the ramping voltage reaches a second voltage level, the processing logic can disable the counter. Once disabled, the counter stops counting clock cycles. In some embodiments, the value of the counter can be stored (e.g., local memory 119 of FIG. 1). The counter value can represent the time it took for the applied ramping to transition from the first voltage level to the second voltage. The counter value can be used to calculate the ramp rate. The ramp rate can be the difference between the second counter value and the first counter value, divided by the counter value. Thus, the higher the counter value, the lower the ramp rate.

In some embodiments, to determine that the ramping voltage reaches the first voltage level, the processing logic can sense, by a first voltage detector, the ramping voltage intercepting the first voltage level. Similarly, to determine that the ramping voltage reaches the second voltage level, the processing logic can sense, by a second voltage detector, the ramping voltage intercepting the second voltage level.

At operation 330, the processing logic determines whether the ramp rate satisfies a defect condition. The defect condition is satisfied if the ramp rate is less than a threshold value (e.g., a leaky WL ramp rate threshold value). Responsive to determining that the ramp rate satisfies the defect condition (i.e., the ramp rate indicates a leaky WL), the method proceeds to operation 340. At operation 340, the processing logic can cause the memory access operation to be aborted (i.e., stops the memory access operation from proceeding). In some embodiments, the processing logic can cause a block with which the wordline is associated to be retired. In some embodiments, the processing logic can add an indicator of the wordline to a leaky block list, which stores indicators of blocks associated with leaky WLs that are no longer to be used.

Responsive to determining that the ramp rate does not satisfy the defect condition, the method proceeds to operation 350. At operation, 350, the processing logic determines whether the ramp rate satisfies a second defect condition. The second defect condition is satisfied if the ramp rate is less than a second threshold value (e.g., a near-leaky WL ramp rate threshold value). The second threshold value can be greater than the first threshold value. That is, the first threshold value can indicate a leaky wordline, while the second threshold value can indicate that the wordline is approaching a leaky wordline status (or near leaky). Responsive to determining that the ramp rate satisfies the second defect condition, the method proceeds to operation 360. Responsive to determining that the ramp rate does not satisfy the second defect condition, the method proceeds to operation 370. At operation 370, the processing logic can enable the memory access operation to proceed.

At operation 360, the processing logic has determined that the ramp rate does not satisfy the defect condition but does satisfy the second defect condition. That is, the ramp rate is between the leaky WL ramp rate threshold value and the near-leaky WL ramp rate threshold value. Thus, at operation 360, the processing logic can cause a block with which the wordline is associated to be retired. Retiring a block with which the near-leaky WL is associated can include adding an indicator of the block to a near-leaky block list. In some embodiments, retiring a block with which the near-leaky WL is associated can include blocking future program operations while still enabling future read operations. For example, when selecting a location to store data, the memory sub-system controller 115 can determine not to use blocks on the near-leaky block list. In some embodiments, the leaky block list and near-leaky block list can store indications of leaky WL and near-leaky WL (respectively), and when selecting a location to store data, the memory sub-system controller 115 can determine not to use location(s) accessible by a WL on the leaky block list and/or the near-leaky block list. The data already stored in the location(s) accessible by the near-leaky WLs (i.e., blocks on the near-leaky block list) can remain there, however after the executing the present memory access operation, location(s) accessible by the near-leaky WLs (i.e., blocks on the near-leaky block list) may no longer be used to program data. The data that is already stored in the location(s) accessibly by the near-leaky WLs (i.e., blocks on the near-leaky block list) can still be read. Once the data stored in location(s) accessible by the near-leaky WLs is invalided, or no longer needed, the block with which the near-leaky WL is associated can be fully retired (i.e., no longer used). After causing the block with which the near-leaky WL is associated to be retired, the method can proceed to operation 370. At operation 370, the processing can enable the memory access operation to proceed.

In some embodiments, the defect condition can be a pass/fail determination. Thus, if the ramp rate is less than or equal to a leaky WL ramp rate threshold value, the processing logic can determine that the WL failed, i.e., that the WL is leaky. Similarly, if the ramp rate is greater than the leaky WL ramp rate threshold, the processing logic can determine that the WL passed, i.e., that the WL is not leaky. In some embodiments, the processing logic can determine that the WL passed responsive to determining that the ramp rate is greater than the near-leaky WL ramp rate threshold value.

Figure 4:
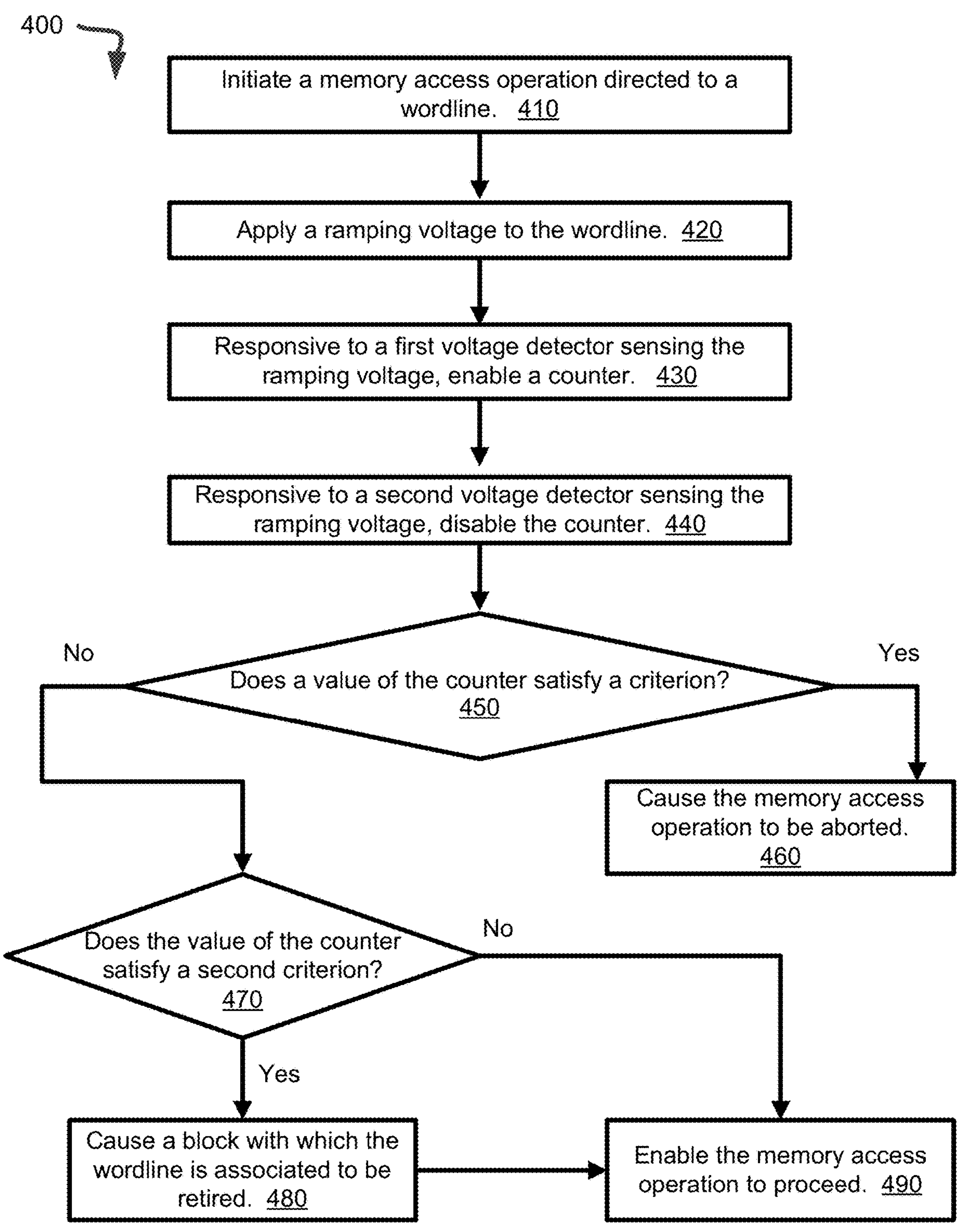
FIG. 4 is a flow diagram of another example method to detect a defect condition on a wordline, in accordance with some embodiments of the present disclosure.

FIG. 4 is a flow diagram of another example method 400 to detect a defect condition on a wordline, in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the ramp rate monitoring component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 410, the processing logic initiates a memory access operation directed to a wordline. The memory access can be a program operation, a sensing operation (i.e., a read operation), an erase operation, a refresh operation, or any other memory access operation. The memory access operation can cause a voltage to be applied to the wordline.

At operation 420, the processing logic applies a ramping voltage to the wordline. At operation 430, responsive to a first voltage detector sensing the ramping voltage, the processing logic can enable a counter. The counter can correspond to a clock. Once enabled, the counter can count clock cycles of the clock. At operation 440, responsive to a second voltage detector sensing the ramping voltage, the processing logic can disable the counter. Once disabled, the counter stops counting clock cycles. In some embodiments, the value of the counter can be stored (e.g., local memory 119 of FIG. 1). The counter value can represent the time it took for the applied ramping to transition from the first voltage level to the second voltage.

At operation 450, the processing logic can determine whether the value of the counter satisfies a criterion. The processing logic can determine that the value of the counter satisfies the criterion responsive to determining that the value of the counter exceeds a threshold value (e.g., a leaky WL counter threshold value). If the value of the counter satisfies the criterion (i.e., the counter value is greater than the leaky WL counter threshold value), the method proceeds to operation 460. If not, the method proceeds to operation 470. At operation 460, the processing logic can cause the memory access to be aborted (i.e., stops the memory access operation from proceeding). In some embodiments, the processing logic can cause the block with which the wordline is associated to be retired. In some embodiments, the processing logic can add an indicator of the block with which the wordline is associated to a leaky block list, which stores indicators of blocks that are no longer to be used.

At operation 470, the processing logic has determined that the value of the counter does not satisfy the criterion (i.e., is less than or equal to the threshold value, e.g., the leaky WL counter threshold value). At operation 470, the processing logic determines whether the value of the counter satisfies a second criterion. The second criterion is satisfied if the value of the counter is greater than a second threshold value (e.g., a near-leaky WL counter threshold value). The second threshold value can be less than the first threshold value. That is, the first threshold value can indicate a leaky wordline, while the second threshold value can indicate that the wordline is approaching a leaky wordline status (or near leaky). Responsive to determining that the counter of the value satisfies the second criterion, the method proceeds to operation 480. Responsive to determining that the counter of the value does not satisfy the second criterion, the method proceeds to operation 490. At operation 490, the processing logic can enable the memory access operation to proceed.

At operation 480, the processing logic has determined that the value of the counter does not satisfy the criterion, but does satisfy the second criterion. That is, the value of the counter is less than or equal to the threshold value (e.g., the leaky WL counter threshold value) but greater than the second threshold value (e.g., the near-leaky WL counter threshold value). Thus, at operation 480, the processing logic can cause the block with which the wordline is associated to be retired. Retiring the block with which the near-leaky WL is associated can include adding an indicator of the block to a near-leaky block list. After causing the block with which the near-leaky WL is associated to be retired, the method can proceed to operation 490. At operation 490, the processing logic can enable the memory access operation to proceed.

In some embodiments, the defect condition can be a pass/fail determination. Thus, if the value of the counter is greater than a leaky WL counter threshold value, the processing logic can determine that the WL failed, i.e., that the WL is leaky. Similarly, if the value of the counter is less than or equal to the leaky WL counter threshold value, the processing logic can determine that the WL passed, i.e., that the WL is not leaky. In some embodiments, the processing logic can determine that the WL passed responsive to determining that the value of the counter is less than the near-leaky WL counter threshold value.

Figure 5:
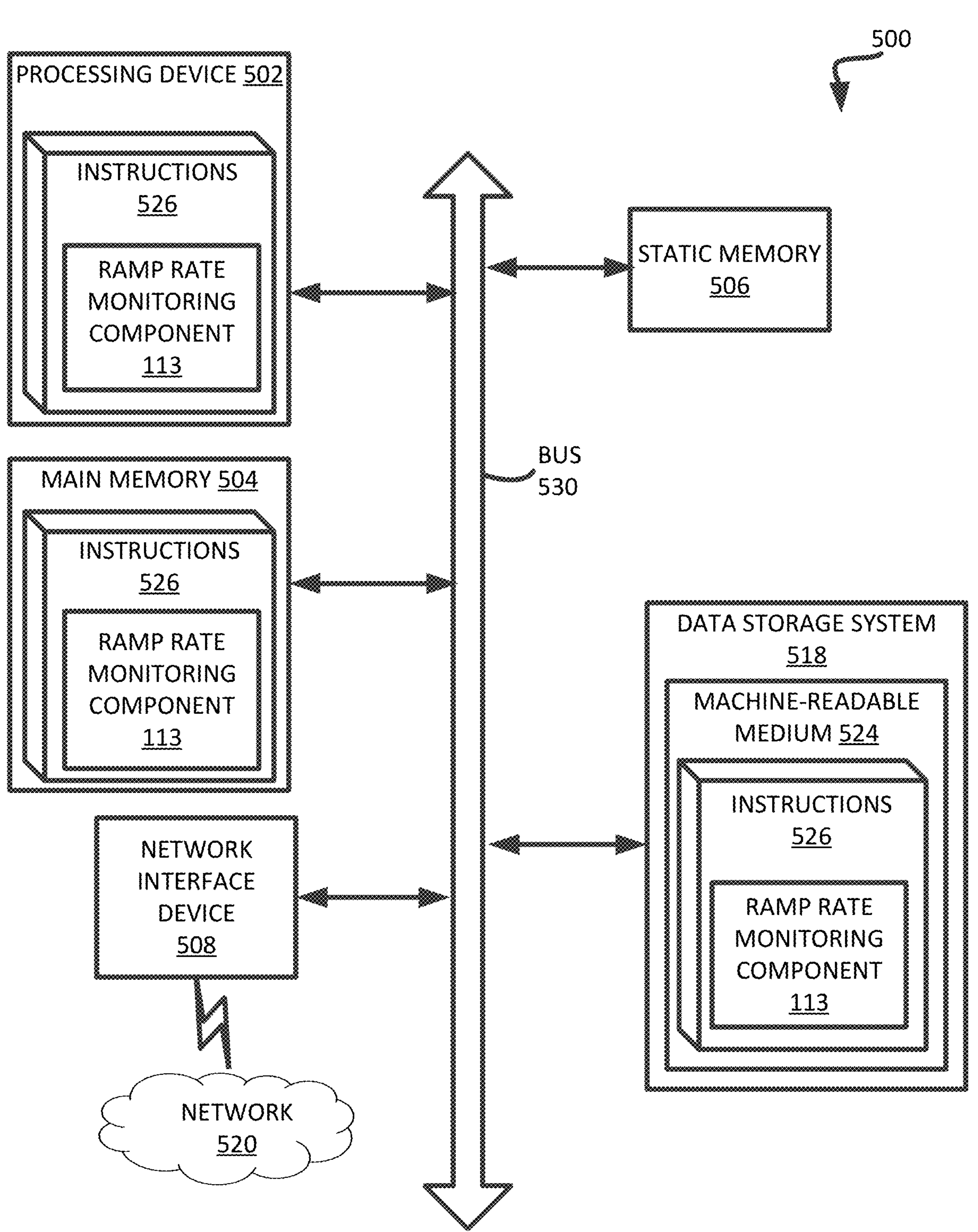
FIG. 5 is a block diagram of an example computer system in which embodiments of the present disclosure may operate.

FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the ramp rate monitoring component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or RDRAM, etc.), a static memory 506 (e.g., flash memory, static random access memory (SRAM), etc.), and a data storage system 518, which communicate with each other via a bus 530.

Processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory sub-system 110 of FIG. 1.

In one embodiment, the instructions 526 include instructions to implement functionality corresponding to a memory access monitoring component (e.g., the ramp rate monitoring component 113 of FIG. 1). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
initiating a memory access operation directed to a wordline;
causing a ramping voltage to be applied to the wordline during the memory access operation;
detecting the ramping voltage on the wordline;
determining, based on the detected ramping voltage, a ramp rate of the wordline; and
responsive to determining that the ramp rate satisfies a defect condition, causing the memory access operation to be aborted.

2. The method of claim 1, wherein the defect condition is satisfied responsive to determining that the ramp rate is less than a threshold value.

3. The method of claim 1, further comprising:
responsive to determining that the ramp rate satisfies one of the defect condition or a second defect condition, causing a block with which the wordline is associated to be retired.

4. The method of claim 1, wherein the detected ramping voltage corresponds to a program pulse or a program verify pulse of a program operation.

5. The method of claim 1, wherein determining the ramp rate of the wordline comprises:
responsive to determining that the ramping voltage of the wordline reaches a first voltage level, enabling a counter;
responsive to determining that the ramping voltage of the wordline reaches a second voltage level, disabling the counter; and
determining the ramp rate based on a value of the counter.

6. The method of claim 5, wherein determining that the ramping voltage of the wordline reaches the first voltage level comprises:
sensing, by a first voltage detector, the ramping voltage intercepting the first voltage level.

7. The method of claim 5, wherein the counter is associated with a clock, the counter to count clock cycles of the clock.

8. A system comprising:
a memory device; and
a processing device, operatively coupled to the memory device, to perform operations comprising:
initiating a memory access operation directed to a wordline;
applying a ramping voltage to the wordline;
responsive to a first voltage detector sensing the ramping voltage at a first voltage level, enabling a counter;
responsive to a second voltage detector sensing the ramping voltage at a second voltage level, disabling the counter; and
responsive to determining that a value of the counter satisfies a criterion, causing the memory access operation to be aborted.

9. The system of claim 8, wherein the value of the counter satisfies the criterion responsive to determining that the value of the counter exceeds a threshold value.

10. The system of claim 8, further comprising:
responsive to determining that the value of the counter satisfies the criterion or a second criterion, causing a block with which the wordline is associated to be retired.

11. The system of claim 8, wherein the ramping voltage corresponds to a ramp phase of one of program pulse or a program verify pulse of a program operation.

12. The system of claim 8, wherein the ramping voltage corresponds to a ramp phase of an erase operation.

13. The system of claim 11, wherein the counter is associated with a clock, the counter to count clock cycles of the clock.

14. A non-transitory computer-readable storage medium comprising instructions that, when executed by a processing device, cause the processing device to perform operations comprising:
initiating a memory access operation directed to a wordline;
causing a ramping voltage to be applied to the wordline during the memory access operation:
detecting the ramping voltage on the wordline;
determining, based on the detected ramping voltage, a ramp rate of the wordline; and
responsive to determining that the ramp rate satisfies a defect condition, causing the memory access operation to be aborted.

15. The non-transitory computer-readable storage medium of claim 14, wherein the defect condition is satisfied responsive to determining that the ramp rate is less than a threshold value.

16. The non-transitory computer-readable storage medium of claim 14, wherein the operations further comprise:
responsive to determining that the ramp rate satisfies the defect condition or a second defect condition, causing a block with which the wordline is associated to be retired.

17. The non-transitory computer-readable storage medium of claim 14, wherein the detected ramping voltage corresponds to a program pulse or a program verify pulse of a program operation.

18. The non-transitory computer-readable storage medium of claim 14, wherein to determine the ramp rate of the wordline, the operations further comprise:
responsive to determining that the ramping voltage of the wordline reaches a first voltage level, enabling a counter;
responsive to determining that the ramping voltage of the wordline reaches a second voltage level, disabling the counter; and
determining the ramp rate based on a value of the counter.

19. The non-transitory computer-readable storage medium of claim 18, wherein the operations further comprise:
sensing, by a first voltage detector, the ramping voltage intercepting the first voltage level.

20. The non-transitory computer-readable storage medium of claim 18, wherein the counter is associated with a clock, the counter to count clock cycles of the clock.

* * * * *